United States Patent [19]
Pell et al.

[11] Patent Number: 6,084,772
[45] Date of Patent: Jul. 4, 2000

[54] ELECTRONICS ENCLOSURE FOR POWER ELECTRONICS WITH PASSIVE THERMAL MANAGEMENT

[75] Inventors: David J. Pell, Ontario; Melik Sahraoui, Ottawa; Trevor G. Zapach, Calgary, all of Canada

[73] Assignee: Nortel Networks Corporation, Montreal, Canada

[21] Appl. No.: 09/146,233

[22] Filed: Sep. 3, 1998

[51] Int. Cl.⁷ ....................................................... H05K 7/20
[52] U.S. Cl. .......................... 361/699; 361/687; 361/700; 361/717; 257/707; 257/713; 174/15.2; 174/16.3; 165/104.21; 165/104.33
[58] Field of Search ..................................... 361/690–699, 361/700–709; 257/706–727; 165/80.2, 80.3, 80.4, 104.21, 104.32, 104.33, 104.14, 104.26, 46, 185; 174/15.2, 52.4, 16.3, 252

[56] References Cited

U.S. PATENT DOCUMENTS

| | | | |
|---|---|---|---|
| 4,673,030 | 6/1987 | Basiulis | 165/32 |
| 4,675,783 | 6/1987 | Murase et al. | 361/385 |
| 4,873,127 | 10/1989 | Onodera et al. | 427/376.8 |
| 4,963,833 | 10/1990 | Mountz | 361/699 |
| 5,285,347 | 2/1994 | Fox et al. | 361/385 |
| 5,332,979 | 7/1994 | Roskewitsch et al. | 331/68 |
| 5,352,991 | 10/1994 | Lipschultz et al. | 330/289 |
| 5,367,434 | 11/1994 | Griffin et al. | 361/719 |
| 5,440,453 | 8/1995 | Cooke et al. | 361/790 |
| 5,651,414 | 7/1997 | Suzuki et al. | 165/104.33 |

*Primary Examiner*—Leo P. Picard
*Assistant Examiner*—Michael Datskovsky
*Attorney, Agent, or Firm*—Angela C. de Wilton

[57] ABSTRACT

An electronics enclosure is provided with passive thermal management for a high power electronic units, for example a power amplifier for wireless telecommunications, the enclosure being suitable for mast head mounted units, or remotely located units exposed to a wide range of weather conditions. The use of heat pipes in place of a conventional heat sink provides for natural convection cooling and eliminates the need for fans. Appropriate selection of materials, using copper and aluminum respectively, for the construction of heat pipe and cooling fin assemblies provides a significant reduction in weight and volume is achieved relative to know units having conventional heatsinks and forced air convection cooling. Since the heat pipe efficiency decreases at low temperature, the power amplifier self heats the unit in cold weather and eliminates the need for heaters. This further reduces the power consumption and the size of the unit.

12 Claims, 9 Drawing Sheets

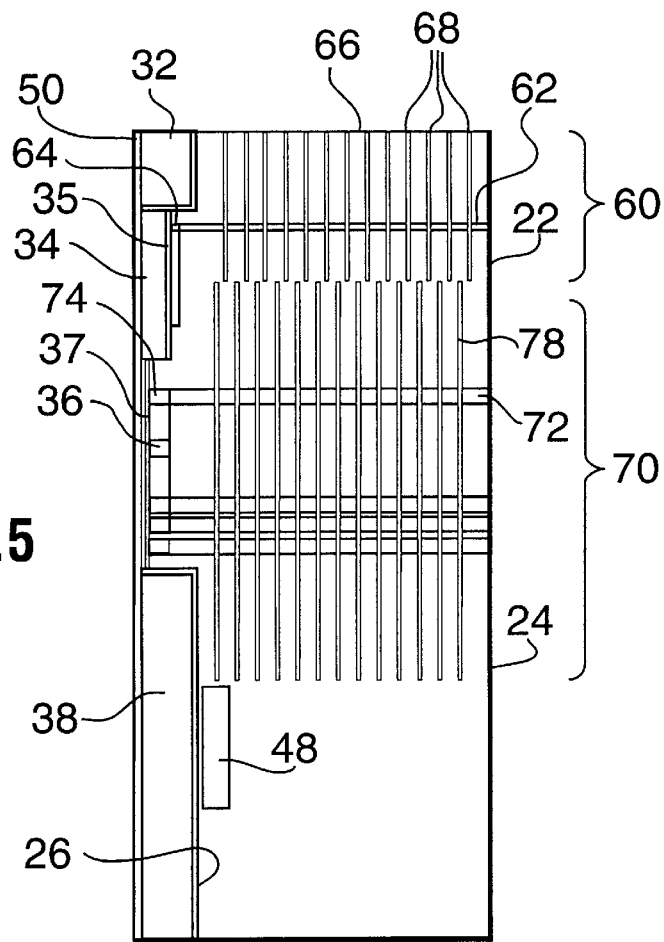
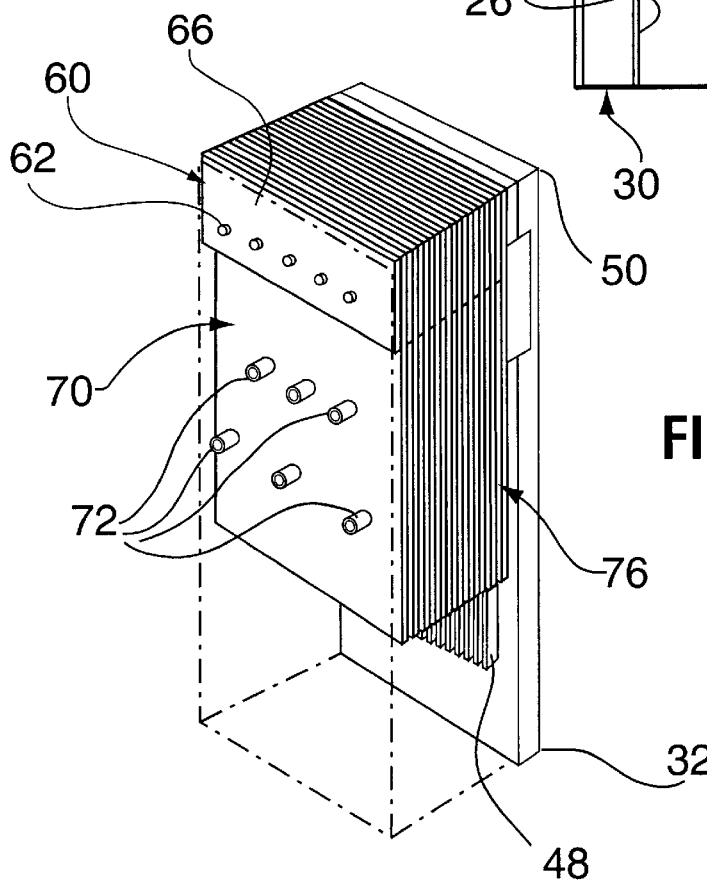

ELECTRONICS ENCLOSURE FOR POWER ELECTRONICS WITH PASSIVE THERMAL MANAGEMENT

FIELD OF THE INVENTION

This invention relates to an electronics enclosure for power electronics with passive thermal management, and a modular heatpipe assembly for an electronics enclosure, for applications such as telecommunications outside plant, including high power wireless telecommunications equipment for use in remote and exposed locations, including wireless antenna mast head units.

BACKGROUND OF THE INVENTION

Wireless telecommunications systems often require high power electronics enclosed in a weather resistant electronic unit which may be deployed remotely, for example, at the top of a mast or tower near an antenna. Such units may be base transceiver stations for wireless communications, for example GSM band wireless communications used in North America and Europe. Mounting of one or more power amplifier units of high power transceiver stations on the mast head close to the antenna is desirable to minimize the losses in the cable from the amplifier to the antenna. Power amplifiers for such applications have high distributed power, typically ~200 W or more. Several high thermal flux components, 10 W to 50 W, may be mounted on individual circuit boards within the unit. Consequently forced air cooling is typically required for warm weather operation to maintain components at a typical maximum transistor flange temperature of 85° C. for a 50° C. ambient atmospheric temperature.

Units for outside plant telecommunications equipment are required to operate over a wide range of weather conditions and temperatures in uncontrolled environments. Depending on climate, extreme ambient temperatures may be the range from −40° C. to +50° C. The enclosure is required to provide protection from the elements. It may include thermal insulation, sealing or other means to control moisture and condensation.

Conventional high power units require cooling in warm weather conditions and heating during cold weather operation to ensure that the operating temperature is maintained in an useful range.

For example, during warm weather, cooling using forced convection may rely on the use of fans or other air movers. Some outside plant, such as CATV cabinets use air conditioners. Air conditioners, fans or other active electronics often result in problems with reliability and servicing requirements for remote or antenna mounted units. Both cooling units and heaters add to the power dissipation, size and weight of the unit.

Conventional heat sink technology, in which a relatively massive heatsink forms a base plate of the enclosure for distribution of heat, can provide high thermal dissipation. For example, a power amplifier assembly capable of dissipating 1100 W in a volume of 0.02 cubic metres is described in U.S. Pat. No. 5,352,991 issued October 1994 using conventional heatsink technology and forced air convection. However a conventional heatsink assembly adds significantly to the size and weight of the enclosure. The relatively large size of the extrusion or casting required for an integral heat sink for power dissipation at this level also adds to manufacturing and installation challenges. Known bonded fin heatsinks overcomes some practical manufacturing problems, but still require a structure which is of relatively large and heavy construction. These large, heavy units are particularly inconvenient for installation and servicing in remote locations, or relatively inaccessible locations, such as antenna masts.

Other known means of heat sinking include the use of heatpipe assemblies. For example, thermal management of power amplifier devices mounted on a metal chassis providing an RF enclosure has been described in U.S. Pat. No. 4,963,833 issued Oct. 16, 1990 entitled 'High powered amplifier and heat sinking apparatus' using a heat sinking device including a heatpipe associated with each power device, which relies direct contact of the heat sinking device with an exposed area of the power amplifier.

U.S. Pat. No. 4,673,030 issued Jun. 16, 1987 entitled 'Rechargeable thermal control system' is an earlier example describing the use of a unidirectional heatpipe as a thermal diode or heat switch in a thermal control system.

A related copending U.S. patent application Ser. No. 08/812 831 filed Mar. 6, 1997, with a common co-inventor with the present application, and to the same assignee, is entitled "Electronic Unit". This application discloses the use of a heatpipe and cooling fin assembly for passive thermal control of an electronic unit, e.g. for telecommunications outside plant housing one or more circuit boards. This structure relies on heat conduction through ends of thermally conductive circuit boards to the heatspreader and heatpipe assembly. Consequently, power dissipation is limited by thermal conduction through ends of the circuit boards. This configuration is not readily adaptable for existing high power RF amplifiers circuit assemblies for high power wireless base-stations mentioned above.

SUMMARY OF THE INVENTION

The present invention seeks to provide an electronics enclosure with improved thermal management, particularly for applications such as high power units for remote locations, or locations with restricted accessibility, such as power amplifiers for wireless telecommunications mast head units, which overcomes or avoids the above mentioned problems.

It is therefore an object of the present invention to provide an improved power electronics enclosure for telecommunications outside plant, and suitable for wireless mast head applications. Therefore according to a first aspect of the present invention there is provided an electronics enclosure for a power electronic unit with passive thermal management comprising:

an electronic unit comprising a plurality of circuit modules supported on one side of a thermally conductive substrate, at least one of the plurality of circuit module comprising power electronic components, a thermal control module associated with each circuit module on an opposite side of the thermally conductive substrate and in thermal contact with the respective circuit module;

the thermal control module associated with the at least one circuit module comprising power electronic components having a heat pipe assembly comprising a plurality of heat pipes in thermal connection at one end with the thermally conductive substrate and coupled to a cooling fin structure at another end of each heatpipe.

Where the electronic unit comprises circuit modules including concentrated power sources such as high power wireless amplifiers mounted on one or more circuit boards or circuit packs within the enclosure, one or more the heat pipe assemblies may be arranged to transport and distribute the thermal loads from these concentrated sources. For economy, heatpipe assemblies for selective dissipation of heat from high power components or boards may be combined with conventional heatsinks or heat spreaders for lower power elements or circuit boards.

Advantageously, for example, where the electronics comprises a set of circuit modules, i.e. circuit boards with different power dissipating components, first and second thermal control modules comprising heat pipe assemblies may be arranged to provide differential thermal management of each circuit board or circuit pack of the electronic unit to optimize thermal management.

Consequently a modular construction may be used. Practically modular heat pipe assemblies may be designed to optimize heat dissipation from individual circuit boards of an electronic unit, for example, to provide a higher density of heat pipes and relatively large area fins associated with high power elements, and a conventional heatsink for low power elements.

Heatpipes are very good heat conductors at high temperature when the working fluid is fluid, and as the working fluid freezes in the condenser the thermal conductivity decreases. Reduced thermal conductivity at low temperatures reduces cooling as the temperature decreases, and thus eliminates the need to compensate for low temperatures with a separate heater, thus providing controlled passive cooling over a range of temperatures.

Preferably the heatpipes comprise copper pipes containing a working fluid which freezes in the condenser pipes at a specified temperature. That is, the heatpipes act as a thermal diode or switch at the freezing point of the working fluid.

Suitable choice of fluid allows for operation of the unit down to −40° C. without the need for heaters.

Advantageously, for application in the present example, the working fluid is water so that freezing of the working fluid occurs at 0° C. This allows electronics to be maintained substantially above 0° C. without auxiliary heating.

Preferably, the electronic enclosure is provided by a modular assembly of circuit modules and thermal control modules, to facilitate assembly and servicing.

According to a further aspect of the present invention there is provided a heatpipe assembly comprising a plurality of heatpipes at one end in thermal contact with a thermally conductive plate, and at an other end having a plurality of cooling fins, the heatpipes being copper, and the fins being aluminum.

Preferably a tin coating is provided on the copper heatpipes and on the aluminum fins before assembly, and the heatpipe assembly is coated with a conventional protective powder coating over the tin coating.

This combination of materials provides for lightweight thin aluminum fins, good thermal conductivity using copper heatpipes, while the disadvantages of using two different metals are mitigated by a tin coating, which is beneficial in providing corrosion protection, and improving adhesion of a powder coating to provide a durable protective coating, while also maintaining good thermal contact between the elements to provide good thermal conductivity of the assembly. To improve rigidity of the aluminum fin assembly, a housing is provided around edges of the fins, and edges of the fins are selectively bonded to the housing at the corners.

Thus aspects of the present invention provides an electronics enclosure with improved passive thermal management with significantly reduced size and weight relative to conventional units, which is operable over a wide range of temperatures without either a heater or other supplementary cooling means.

Thermal dissipation up to 11000 watts per m$^3$ was achieved with a compact, lightweight, passive thermal management system, with natural convention.

Since the thermal management system is passive, reliability and maintenance requirements are also reduced relative to conventional enclosures with forced air cooling and auxiliary heaters. In combination with the reduced weight and size of the enclosure, this is particularly convenient for outside plant for remote locations, or for example for mast head applications for wireless telecommunications.

BRIEF DESCRIPTION OF THE DRAWINGS

The invention will now be described in greater detail with reference to the attached drawings wherein:

FIG. 5 shows a cross-sectional view through the electronics enclosure through line V—V of FIG. 3

FIG. 6 shows a cut away perspective view on of the unit shown in FIG. 3.

DETAILED DESCRIPTION OF THE INVENTION

The above referenced related copending U.S. patent application Ser. No. 08/812,831 filed Mar. 6, 1997, entitled Electronic Unit (having a common co-inventor with the present application) discloses the use of heatpipe means and a cooling fin structure for passive thermal management of a thermally insulated unit containing one or more circuit boards in thermal contact with the enclosure. This application is incorporated herein by reference. In summary, the disclosed structure relies on the properties of heat pipes wherein thermal conduction is reduced below the freezing point of the working fluid to allow self heating of the unit, while cooling by the heat pipes is more efficient at higher temperatures. The housing forms a solar shield with deep louvres to allow air flow by natural convection around the cooling fin structure. This structure provides effective thermal management for units dissipating 20 W to 1000 W, housing typically 1 to 5 circuit boards, without a heavy heatsink structure, thus significantly reduces the weight of the unit, while providing effective thermal management using a conventional housing for mounting a series of circuit boards. The structure described is designed for relatively small, wall mounted unit, typically dissipating up to 700 W in a volume of 0.025 m$^3$. One or more thermally enhanced circuit boards in thermal connection with a thermally conductive rail or plate for carrying heat to the heat pipes and fin structure. A moisture permeable membrane, e.g. a Goretex patch is used to assist in humidity control within the housing to control condensation of moisture which may damage components.

The heatpipes are designed for freezing of working liquid in the sub zero range to maintain the unit above zero degrees. However this unit is designed for relatively small, wall mounted units, e.g. a compact unit comprising one or more circuit boards in a conventional stacked mounting arrangement within an insulated chamber and relies on thermal conduction through ends of the circuit boards.

However, other known power electronic units comprise a plurality of circuit modules or circuit boards arranged on a common, substantially planar, substrate, and the above described enclosure is not readily adapted for an electronic unit of this structure.

Figure 1:
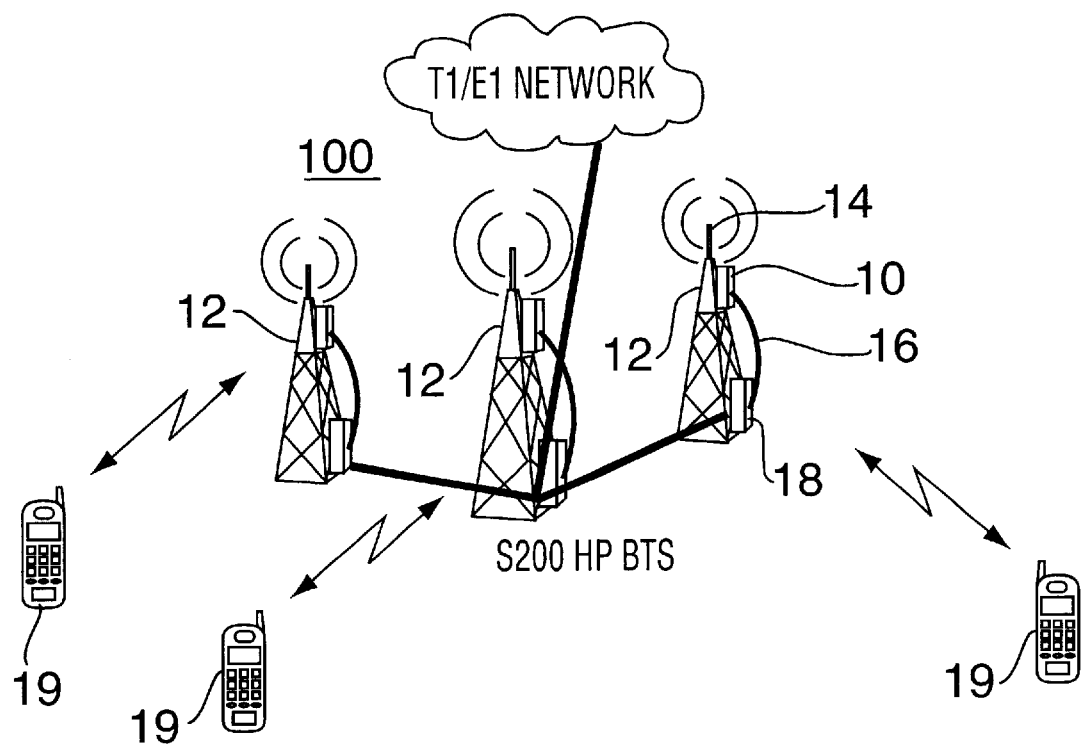
FIG. 1 shows a schematic diagram of a wireless telecommunications network base transceiver station with an electronics enclosure according to a first embodiment of the present invention mounted on an antenna mast head.

An electronic enclosure 10 according to a first embodiment of the present invention, mounted on an antenna mast head 12, often referred to as a Masthead Electronic Unit (MEU), is shown in FIG. 1, which shows schematically a wireless base transceiver station forming part of a telecommunications network 100, including a number of similar units on antenna mastheads 12, for wireless telecommunications with personal communications devices, such as wireless telephones 19.

The electronics enclosure 10 contains an electronic unit including a power amplifier assembly for wireless communications, and is mounted closed to the antenna 14 to reduce losses in the cable (not shown) from the enclosure 10 to the antenna 14. The enclosure 10 has a wired connection 16 with a core module 18 mounted near the base of the mast 12. Enlarged perspective views of the electronics unit 10 are shown in FIGS. 2 and 3.

Figure 2:
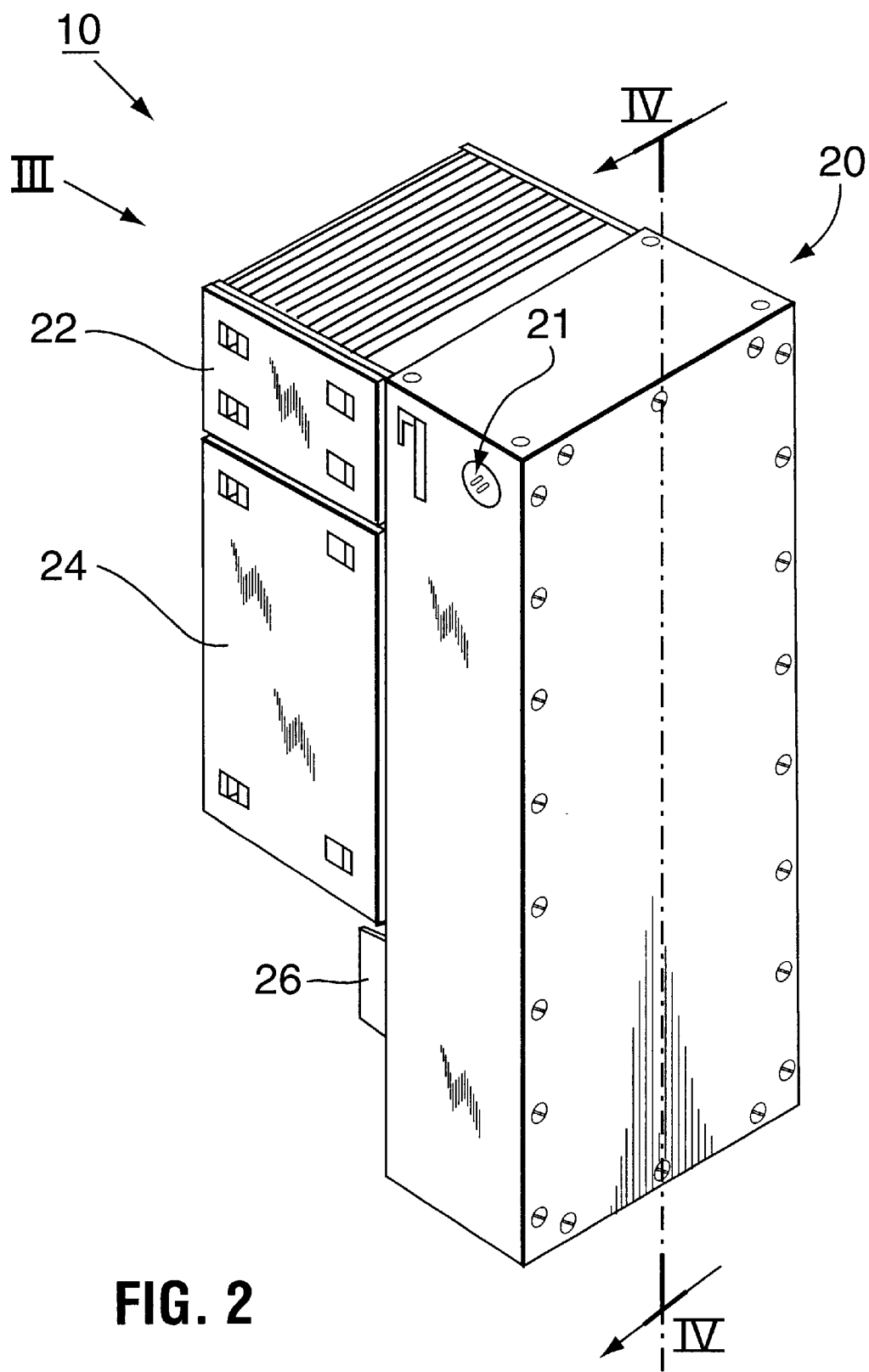
FIG. 2 shows a perspective view of an electronics enclosure of the first embodiment.
Figure 3:
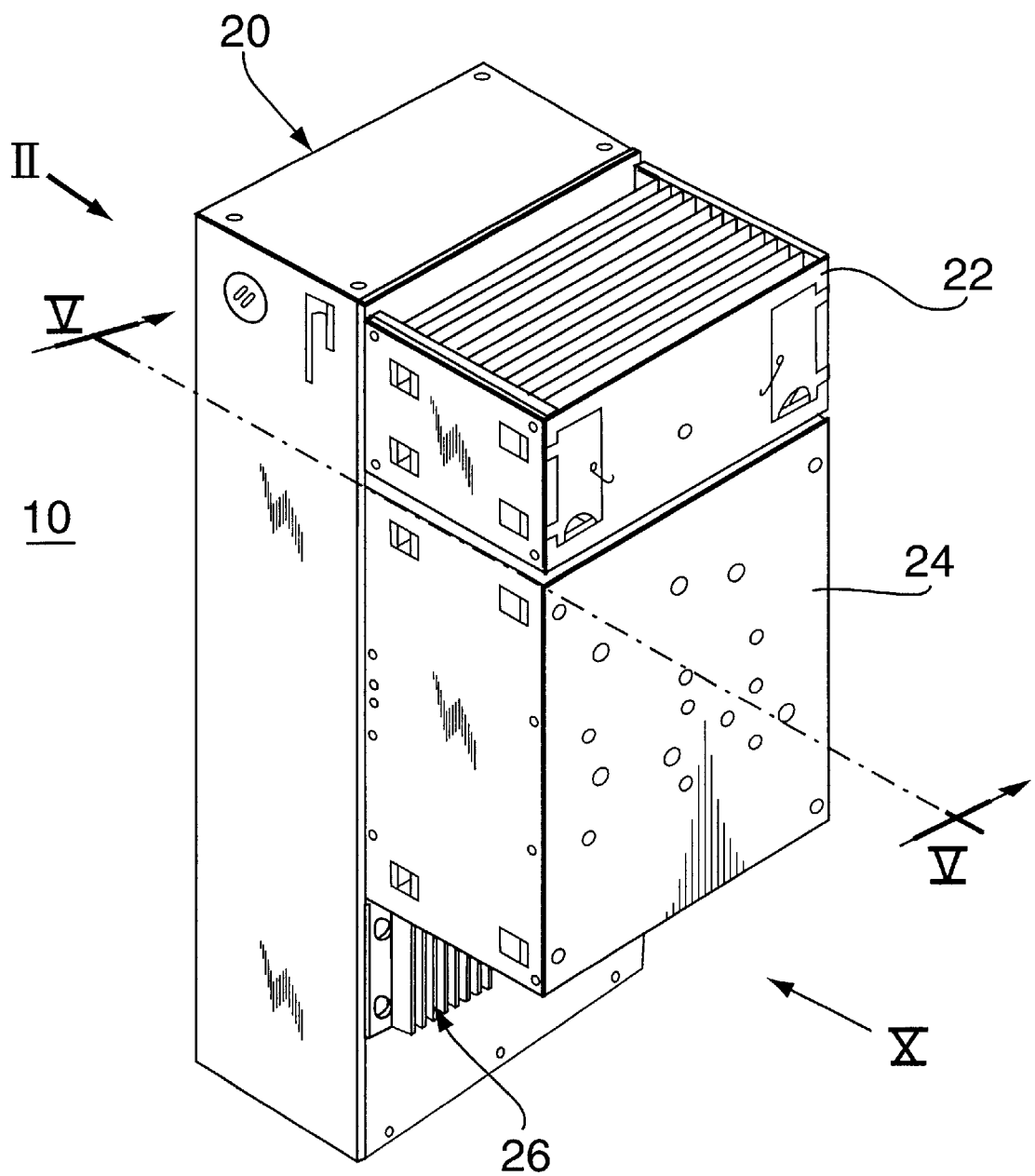
FIG. 3 shows another perspective view of the enclosure from the direction of arrow III of FIG. 2.

The enclosure 10 shown in FIGS. 2 and 3 is designed to accommodate an electronic unit, including a high power RF amplifier and associated electronics within housing 20. Associated with the housing 20 are thermal control modules 22, 24, and 26 to provide thermal management of the enclosure to maintain an appropriate operating temperature of the electronic unit in an uncontrolled environment, such as encountered by an enclosure mounted outdoors, for example, on an exposed antenna mast head. The thermal control modules are designed to work in combination with the electronic unit maintain a useful operating temperature for reliable operation over a wide range of weather conditions, desirably over a temperature range as wide as −40° C. to +50° C.

Figure 4:
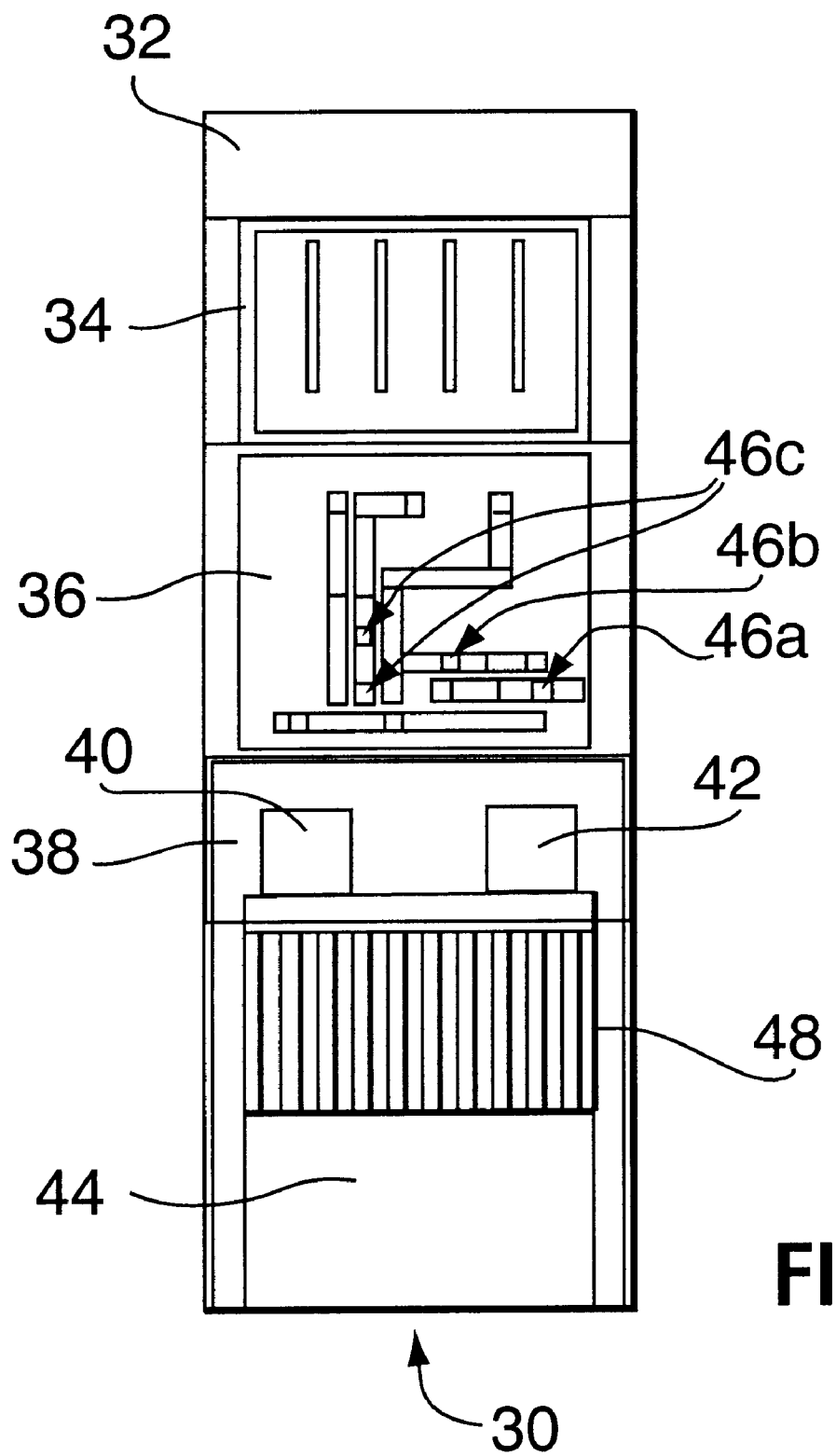
FIG. 4 shows a cross-sectional diagram through an electronics enclosure through line IV—IV of FIG. 2 showing the power electronics unit housed within the enclosure.

As shown in more detail in FIG. 4, which is a cross-section through the housing 20, through line IV—IV of FIG. 2, there is a plan view of the electronic unit 30 which comprises an assembly 32 of three electronic circuit boards 34, 36 and 38, which are mounted within the housing 20. The assembly 32, shown schematically in FIG. 4, represents a Nortel S 2000wireless transceiver base-station electronic unit, which comprises three circuit modules, or circuit boards, comprising a digital circuit board 34, an RF circuit board 36, a duplexer and low noise amplifier (LNA) board 38, for example, having an combined area of about 200 mm×275 mm. The RF board 36 dissipates approximately 200 W in total, and includes pre-driver transistors 46a dissipating 14 W each, and driver transistors 46b dissipating 28 W, and output transistors 46c dissipating 40 W. Each occupies an area of about 6 mm by 10 mm. The digital board 34 including power amplifiers PA dissipates 38 W.

The low noise amplifiers 40 and 42, dissipate 4.7 W each and the duplexer 44 dissipates 5 W. As shown in FIG. 4, the LNAs 40 and 42 and duplexer 44, on board 38 which dissipate moderate power, share a common conventional heat sinking means 48 in the lower part of the assembly 32.

FIG. 5 shows a cross section through the enclosure 10 along line V—V of FIG. 3. As shown in FIG. 5, the boards 34, 36 and 38 forming assembly 32 are mounted on a common thermally conductive substrate 50, e.g. an aluminum spreader plate, in a substantially coplanar arrangement, although in this particular arrangement, the lower part is offset to accommodate larger components on board 38. Each circuit board 34,36 and 38 is associated with a respective thermal control module 22, 24, and 26. The boards 34, 36 and 38 may be thermally enhanced e.g. have a thermally conductive core to further improve thermal dissipation from components on the board.

Thermal control module 26 comprises the conventional heat sinking means 48 in thermal contact with the LNAs 40 and 42 and duplexer 44. In contrast, the thermal control modules 22 and 24 associated with the higher power circuit boards 34 and 36 comprise heat dissipating means 60 and 70 respectively provided by heatpipe assemblies.

Specifically, module 22 comprises heatpipe assembly 60 having a plurality of heatpipes 62, in thermal contact at one end 64 with a base plate 35 of circuit board 34, and at the other end provided with thermal dissipation means 66 in the form of a cooling fin structure comprising a plurality of parallel cooling fins 68 arranged vertically for dissipation of heat by radiation and natural convention. Similarly module 24 includes heatpipe assembly 70 having a plurality of heatpipes 72, in thermal contact at one end 74 with the base plate 37 of circuit board 36, and at the other end provided with cooling means 76, i.e. a plurality of parallel cooling fins 78.

Figure 7:
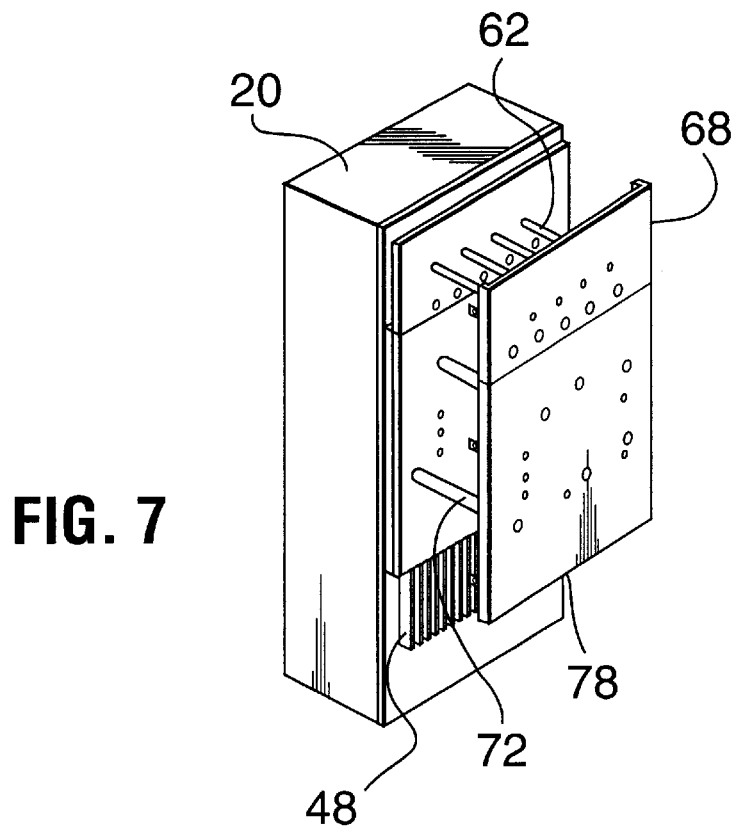
FIG. 7 shows another cut away perspective view of the unit shown in FIG. 3, showing further details of the heatpipe assembly and fin structure.
Figure 8:
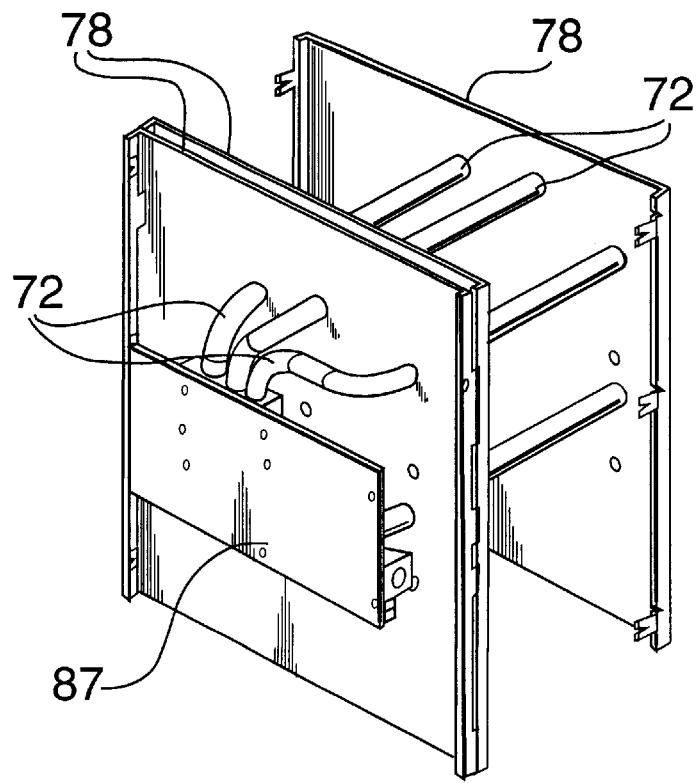
FIG. 8 shows an enlarged alternative perspective view of details of the heatpipe assembly 24 of FIG. 7, with some fins removed to show the heatpipes.

A enlarged partially cut away view of the unit 10 shown in FIG. 7 from the same view as FIG. 3, with the cover removed, and some fins removed to show more detail in the heat pipe assemblies of the thermal modules. As shown in the opposite perspective view in FIG. 8, a thermally conductive baseplate 87 attaches to the baseplate 37 of circuit board 36 and transports heat to the array of heat pipes 72, which are arranged in thermal connection with a series of cooling fins 78.

Figure 9A:
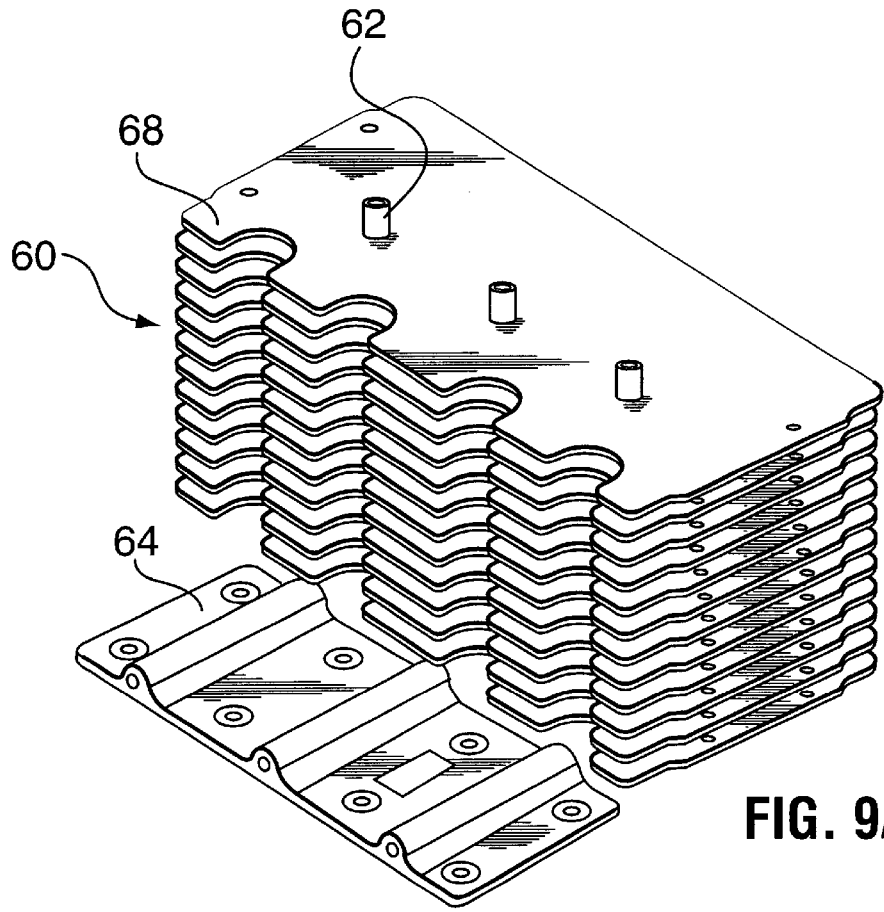
FIGS. 9A and 9B show an oblique views of part of first and second heatpipe assemblies respectively, showing arrangements of the heatpipes and cooling fins.
Figure 9B:
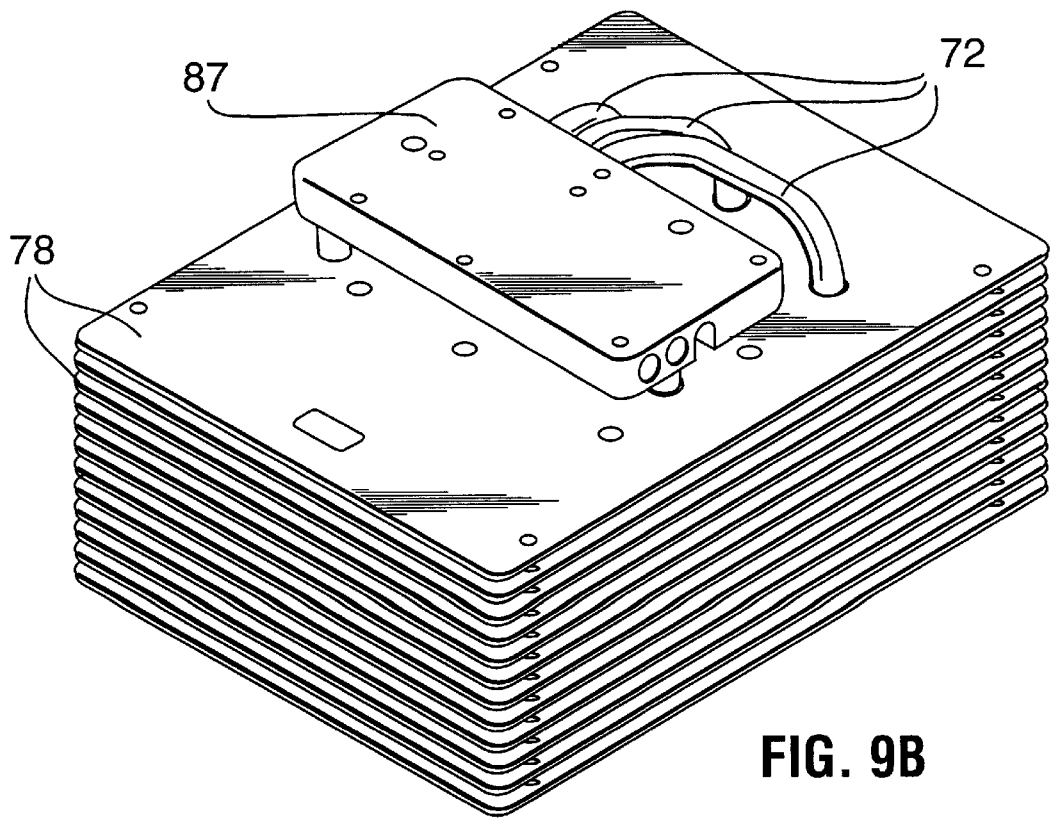

FIG. 9A is an oblique view showing the construction of the heat pipe and fin assembly 60 of module 22, in which three heat pipes 62 are spaced apart across the thermally conductive plate 64 for mounting in thermal contact with an the area of the digital circuit board 34 to conduct heat to the fins 68 and thus dissipate heat from the associated digital circuit board. FIG. 9B is an oblique view showing construction of the heat pipe and fin assembly 70 of module 24 for cooling the RF circuit board. In contrast to the assembly 60, the heatpipes 72 of assembly 70 are concentrated to remove heat selectively from the region of a relatively small thermally conductive base plate 87, for mounting in thermal contact with the high power components 46a, 46b, 46c on the RF board 36, and the relatively large fins extend beyond the edges of the RF circuit board, and provide effective heat dissipation from the high power components on the RF circuit board. Beneficially, to reduce the weight of the module, the fins of each module are made relatively thin, and are constructed of aluminum. To compensate for the reduction in rigidity and ruggedness of the lightweight fin structure, the outermost fins of the unit are fastened to the housing 80 at attachment points 81 and 83, and each fin is attached to the housing at each corner, by a viscoelastic sealant adhesive, such as line of a silicone adhesive along each inside corner 85 of the housing 80, shown in FIG. 10. This construction provided improved rigidity of the unit to protect against vibration and thermal/mechanical shock.

As shown in the figures, the circuit boards are arranged on the common substrate 50 which is mounted vertically, and the conventional heatsink 48 for cooling the duplexer circuit and low noise amplifiers mounted at lower end of the substrate 50, and the thermal control modules 24 and 22 for the RF circuit board 36 and the digital circuit board 34 respectively mounted one above the other to allow for airflow vertically between the cooling fins, by natural convection.

The first and second heatpipe assemblies 60 and 70 operate independently. Fins of the first and second heatpipe assemblies are arranged in a staggered arrangement for more effective heat transfer by natural convection. Thus, the number of heatpipes and relative area of the fins are designed to balance or match thermal dissipation of the different circuit boards.

Figure 10:
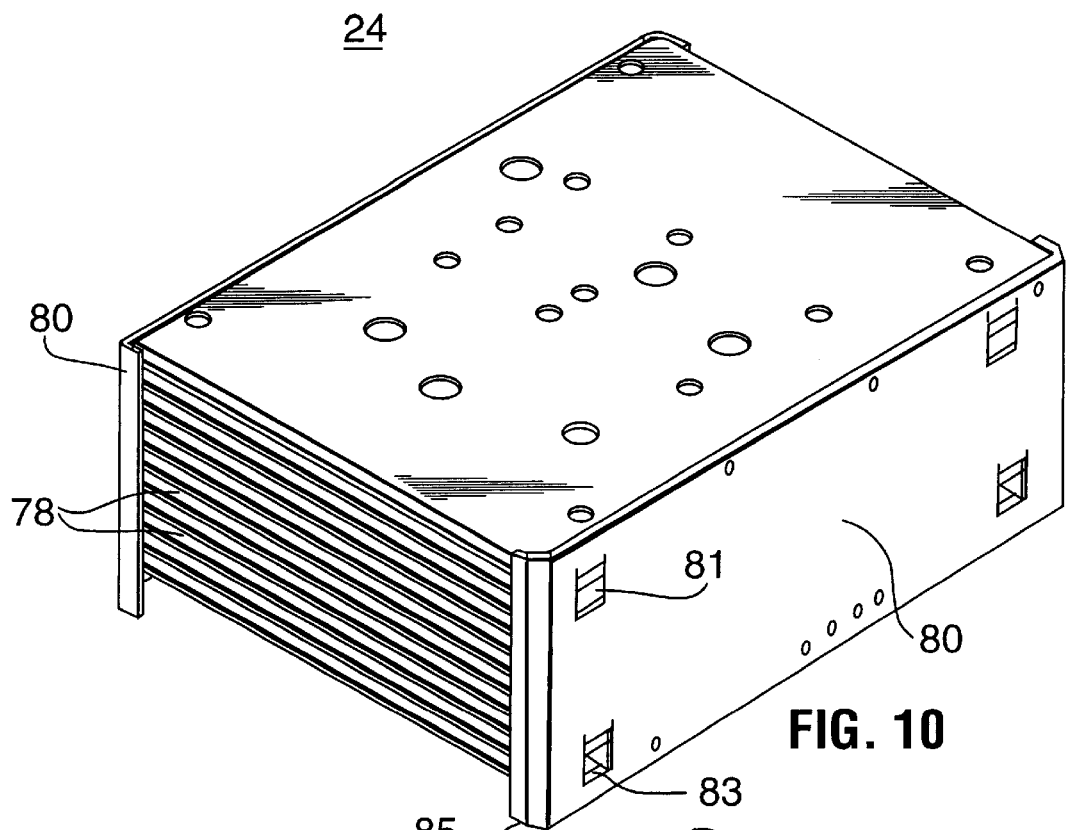
FIGS. 10 and 11 show two views of module 24 with external housing 80.
Figure 11:
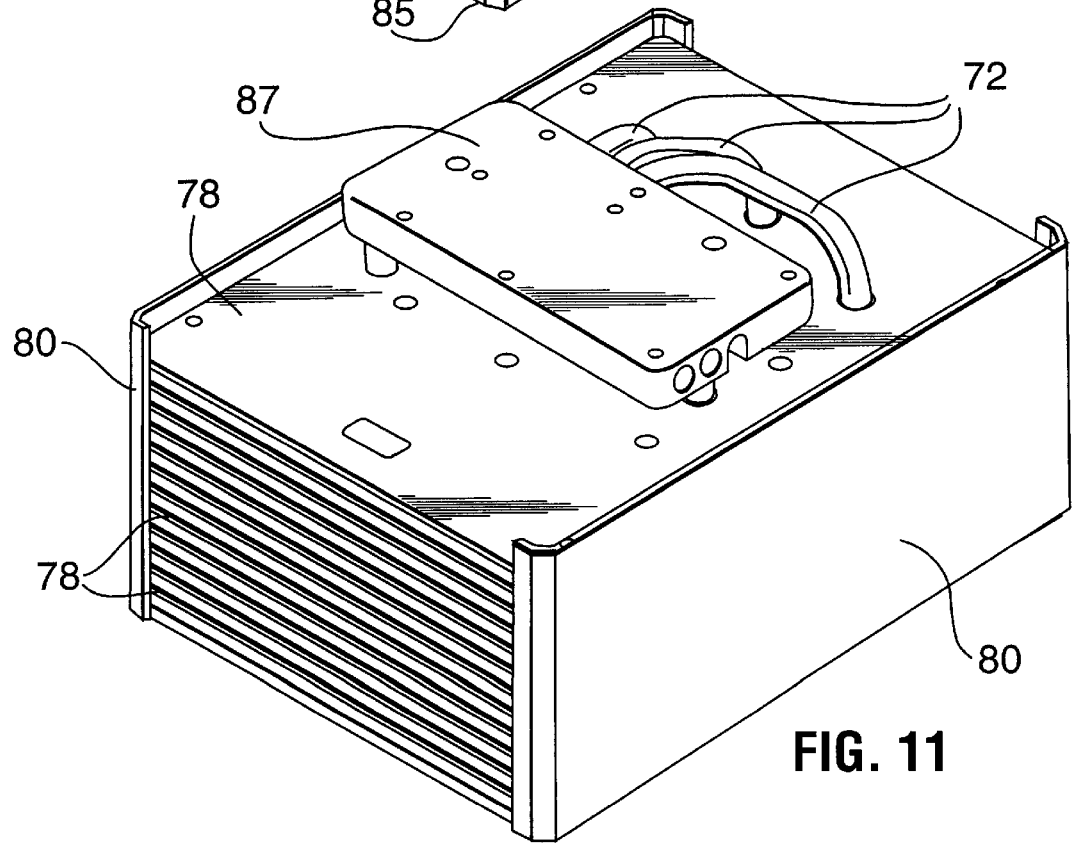

Each module 22, 24, and 26 includes a weather resistant housing, e.g. housing 80 partially enclosing fins of module 24 as shown in FIG. 10 to provide protection from the elements. The housing 80 is provided with vents at the top and bottom of the unit to allow natural convection to occur with cool air flow in at the bottom of the unit and heated air exiting from the top of the unit.

Beneficially, the external housing is provided the vents or louvres are arranged to provide a solar shield as described in the above mentioned Zapach application.

In the preferred embodiment, to provide high thermal conductivity, copper heat pipes using water as the working fluid were selected, and aluminium fin structures were used to reduce the weight. The housing was also made of aluminium.

Figure 12:
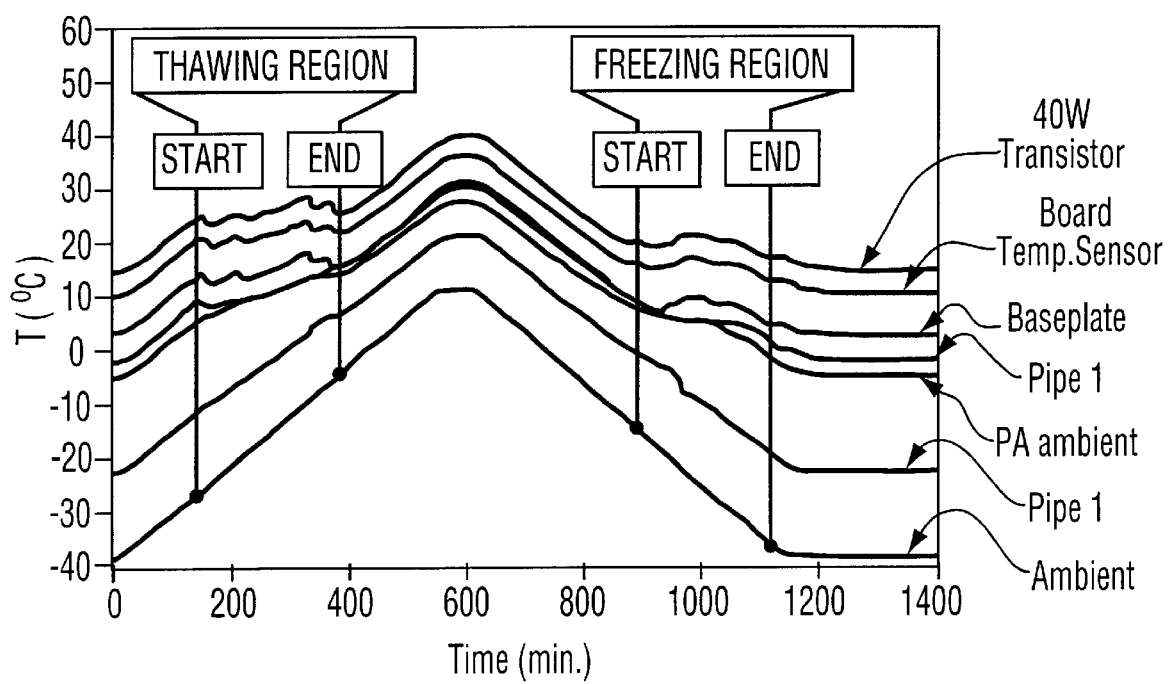
FIG. 12 is a graph showing the performance the enclosure during thermal cycling from −40° C. to +10° C.

The freeze out of the heatpipes was designed to occur at 0° C. by using water as the working fluid, and to keep the board temperature above 0° C. even when the ambient temperature goes down to −40° C. As shown in FIG. 12, the results of thermal cycle over temp range from +10° C. to −40° C. shows how the freeze out of the working fluid at 0° C. can be used to advantage to damp thermal fluctuations around 0° C., and further extend low temperature operation by relying on self heating by the power components without need for auxiliary heating means at temperatures below 0° C. when the heat pipes cease to operate.

In selecting water as the working fluid, the use of copper heatpipes rather than aluminum is preferable for long term reliability. Corrosion of aluminum by water may be a problem for long term operation. In this application, aluminum is preferred for the fins to reduce the weight relative to copper fins. It is well-known that combination of different metals in contact may result in galvanic corrosion, and typically a powder coating is used when different metals are to be used together, e.g. copper and aluminum, to reduce corrosion. It is also necessary to have a good thermal and mechanical contact between the heat pipes and the cooling fins. While conventional powder coatings may be used, when combining copper heatpipes with aluminum fins as described, conventional powder coatings were not entirely satisfactory. It was found to be advantageous to use a tin coating, provided on both the copper heatpipes and aluminum fins to provide a corrosion resistance coating and to provide a good thermal and mechanical contact between these components. The tin coating provided superior coating characteristics on the lightweight thin fin structure of this design, both in terms of uniformity of coating and resistance to thermal and mechanical shock at the interfaces between the fins and the heatpipes. A conventional protective powder coating was used over the tin coating.

The enclosure described above was field tested and shown to be capable of keeping the component junction temperature below 85° C. for a 50° C. ambient using natural convection and for powers in excess of 200 Watts.

The two heatpipe assemblies have a combined volume of 0.018 cubic meters, and a weight of less than 4.4 kg. The total weight of the unit is reduced from about 44 kg using a conventional heatsink assembly to less than 22 kg and volume of 69 litre for the electronic unit of the embodiment. This represents 40% weight reduction and 25% volume reduction compared with conventional heatsink design providing similar performance. For comparable heat sinking capabilities, a bonded fin heatsink having weight of 14 kg and total weight of the enclosure and electronics 35 kg and volume 81 litres was required.

The unit provides an equivalent to a power dissipation per unit volume of 11000 Watts $m^{-3}$, which is significantly higher than other available known power electronics enclosures for similar applications using completely passive thermal management.

Other advantages include the modular design so that thermal control modules with heatpipe assemblies can be provided to match thermal load of the particular board with power components and/or be combined with inexpensive conventional heatsink assemblies for boards having lower power components. Thus a high density of heatpipes and/or larger area cooling fins may be used with circuit modules dissipating greater power, and fewer heatpipes, and/or smaller area cooling fins may be associated with lower power circuit modules, to optimize heat dissipation in the available volume of the enclosure. Modular construction also facilitates replacement of parts if servicing or repair are required.

Fans or other active electronics to provide force air cooling are not required. Since the preferred embodiment used water as the working fluid in the heatpipes, which freezes out and therefore act as a thermal switch at 0° C., self-heating of the unit regulates operation at sub-zero temperatures without the need for auxiliary heaters.

Counter gravity flow degrades performance of heatpipes. Thus, the design and mounting of the unit preferably provides for orienting the unit so that the pipes are correctly oriented and maximum limits of power dissipation of individual heatpipes is accounted for in the arrangement of the heatpipes in the thermal control modules, to provide optimum performance over the required operating range.

Humidity control is achieved by designing the thermal control modules to keep the electronic unit 20 at 7° C. to 10° C. above the ambient temperature, thereby reducing condensation and moisture build up on the electronic components. A moisture permeable membrane, e.g. a Goretex patch 21 shown on the side of unit 20 of FIG. 2 provides for controlled moisture exchange with the external environment, in a conventional manner.

It will be apparent that the thermal control modules described above may be designed to provide thermal management to various alternative arrangements of electronic units with circuit boards having different arrangements of low power and high power electronic components.

Practically, it is advantageous for each of the circuit boards to be mounted in a coplanar manner on a common heatspreader plate, but other arrangements of circuit boards may also be contemplated which accommodate respective thermal control modules comprising one of more heatpipe assemblies, and conventional heatsinks to match the thermal load of each circuit board.

While the term circuit board has been used above to describe typical electronic circuit assemblies or circuit modules, it will be apparent that the enclosure described above is adaptable to other conventional circuit assemblies or electronic units, for example circuit packs or other conventional electronic circuit assemblies mounted on substantially planar substrates.

Thus, although specific embodiments of the invention have been described in detail, it will be apparent that numerous variations and adaptations of these embodiments are contemplated within the scope of the following claims.

What is claimed is:

1. An electronics enclosure for a power electronic unit with passive thermal management comprising:

a modular electronic unit comprising circuit modules mounted on a substantially planar thermally conductive substrate, the circuit modules being arranged vertically above one another, and each circuit module having an associated thermal control module in thermal contact with the circuit module, a plurality of the circuit modules being higher power modules comprising power components, and the thermal control module associated with each of the higher power modules comprising a heat pipe assembly;

the thermal control module associated with each other circuit module comprising a conventional heatsink; and, the heatpipe assemblies of the thermal control modules being arranged one above the other with cooling fins of the heatpipe assemblies arranged vertically, to provide for air flow vertically by natural convection through fins of the heatpipe assemblies and over the conventional heatsink.

2. An enclosure according to claim 1 wherein the thermal dissipation of each thermal control module is matched to the thermal dissipation of the associated circuit module.

3. An enclosure according to claim 1 wherein the plurality of circuit modules comprising power electronic components, and the associated thermal control modules comprise heat pipe assemblies arranged to selectively transport and dissipate heat from regions of the circuit module carrying the power electronic components.

4. An enclosure according to claim 1 wherein the heatpipes comprise copper pipes containing a working fluid which freezes in the condenser pipes at a specified temperature.

5. An enclosure according to claim 4 heatpipes wherein the working fluid is water so that freezing of the working fluid occurs at 0° C.

6. An enclosure according to claim 1 wherein cooling fins of one module are laterally offset relative to fins of an adjacent module.

7. An enclosure according to claim 1 capable of thermal dissipation up to 11000 watts per $m^3$ by natural convection.

8. An enclosure according to claim 1 comprising a modular assembly of circuit modules and associated thermal control modules.

9. An enclosure according to claim 1 wherein each heatpipe assembly comprises copper heatpipes and aluminum fins.

10. An enclosure according to claim 9 wherein the copper heatpipes and aluminum fins have a tin coating.

11. An enclosure according to claim 10 wherein the heatpipe assembly has a powder coating overlying the tin coating.

12. An electronics enclosure according to claim 1 wherein a thermal control module associated with a circuit module comprising a conventional heatsink is positioned below the thermal control modules associated with the higher power modules, so as to direct air flow vertically through fins of the heatpipe assemblies, over the conventional heatsink by natural convection.

* * * * *